US008803751B1

(12) United States Patent
Miller et al.

(10) Patent No.: US 8,803,751 B1
(45) Date of Patent: Aug. 12, 2014

(54) MULTIFERROIC ANTENNA AND TRANSMITTER

(75) Inventors: Robert J. Miller, Fall City, WA (US); William Preston Geren, Shoeline, WA (US); Stephen P. Hubbell, Gig Harbor, WA (US)

(73) Assignee: The Boeing Company, Chicago, IL (US)

( * ) Notice: Subject to any disclaimer, the term of this patent is extended or adjusted under 35 U.S.C. 154(b) by 676 days.

(21) Appl. No.: 12/885,817

(22) Filed: Sep. 20, 2010

(51) Int. Cl.
*H01Q 1/00* (2006.01)
*H01Q 7/06* (2006.01)
*H01Q 3/44* (2006.01)
*H01L 41/00* (2013.01)

(52) U.S. Cl.
CPC . *H01Q 7/06* (2013.01); *H01Q 3/44* (2013.01); *H01L 41/00* (2013.01)
USPC .......................................................... 343/787

(58) Field of Classification Search
USPC .................................................. 343/700 MS
See application file for complete search history.

(56) References Cited

U.S. PATENT DOCUMENTS 5,675,252 A 10/1997 Podney
5,694,134 A * 12/1997 Barnes .................... 343/700 MS
5,994,891 A 11/1999 Hubbell
6,184,841 B1 2/2001 Shober
6,297,579 B1 * 10/2001 Martin et al. ................ 310/330
6,362,617 B1 3/2002 Hubbell
7,023,206 B2 * 4/2006 Viehland et al. .............. 324/249
7,514,804 B2 * 4/2009 Wang ............................ 290/1 R
7,952,349 B2 5/2011 Huang
2006/0279171 A1 12/2006 Viehland
2007/0252593 A1 11/2007 Takeuchi
2009/0001980 A1 * 1/2009 Geren et al. .................. 324/252
2009/0085695 A1 * 4/2009 Srinivasan ................ 333/219.2
2009/0243607 A1 10/2009 Mather
2010/0015918 A1 1/2010 Liu
2010/0180687 A1 7/2010 Hammerschmidt

OTHER PUBLICATIONS

Dapino, Smith, Calkins, Flatau, "A Magnetoelastic Model for Villari-Effect Magnetostrictive Sensors", 2002, North Carolina State University Center for Research in Scientific Computation.*
Zhou et al, "Young's Modulus Measurement of Thin Film PZT", 1999, IEEE, pp. 153-156.*
Hoperoft et al, "What is the Young's Modulus of Silicon?", Apr. 2010, Journal of Microelectromechanical Systems, vol. 19, pp. 229-237.*

(Continued)

*Primary Examiner* — Hoang V Nguyen
*Assistant Examiner* — Patrick Holecek
(74) *Attorney, Agent, or Firm* — Charles L. Moore; Moore & Van Allen PLLC

(57) ABSTRACT

A multiferroic element may include a substrate formed on an electrically conductive ground plane. The substrate may be formed from a material having a predetermined elastic modulus. A layer of piezoelectric material may be formed on the substrate. A layer of magnetostrictive material may be bonded to the layer of piezoelectric material. A mechanical strain is created in the layer of piezoelectric material in response to a voltage signal being applied to the multiferroic element. The mechanical strain in the layer of piezoelectric material causes a mechanical strain in the layer of magnetostrictive material to produce a radio frequency magnetic field that is proportional to the voltage signal for generating a radio frequency electromagnetic wave. The predetermined elastic modulus of the substrate is substantially lower than an elastic modulus of the layer of piezoelectric material.

23 Claims, 7 Drawing Sheets

(56) References Cited

OTHER PUBLICATIONS

Dong, Shuxiang, et al. "Enhanced magnetoelectric effects in laminate composites of Terfenol-D/Pb(Zr,Ti) O3 under resonant drive", Applied Physics Letters, 83(23)4812-4814 (Dec. 8, 2003).
Dong, Shuxiang, et al., "A strong magnetoelectric voltage gain effect in magnetostrictive-piezoelectric composite", Applied Physics Letters, 85(16):3534-3536 (Oct. 18, 2004).
Zhai, Junyi, et al., "Detection of pico-Tesla magnetic fields using magneto-electric sensors at room temperature", Applied Physics Letters, 88(062510):1-3 (2006).
Zhai, Junyi, et al., "Giant magnetoelectric effect in Metglas/polyvinylidene-fluoride laminates", Applied Physics Letters, 89(083507)1-3 (2006).
Dong, Shuxiang, et al., "Magnetoelectric effect in Terfenol-D/Pb(Zr, TiO)3/μ-metal laminate composites", Applied Physics Letters, 89(122903)1-3 (2006).
Dong, Shuxiang, et al., "Near-ideal magnetoelectricity in high-permeability magnetostrictive/piezofiber laminates with a (2-1) connectivity", Applied Physics Letters 89(252904)1-3 (2006).
Lou, J., et al., "Giant microwave tunability in FeGaB/lead magnesium niobate-lead titanate multiferroic composites", Applied Physics Letters, 92(262502)1-3 (2008).
Vopsaroiu, Marian, et al., "Multiferroic magnetic recording read head technology for Tbit/in.2 and beyond", Journal of Applied Physics, 103(07F506)1-3 (2008).
UK Intellectual Property Office, Combined search and Examination Report under Sections 17 and 18(3) for GB Application GB10115436.7 dated Jan. 17, 2011, pp. 1-7.
United States Patent and Trademark Office, U.S. Appl. No. 12/561,498 Non-Final Office Action dated Jan. 5, 2012, pp. 1-19.
United States Patent and Trademark Office, U.S. Appl. No. 12/561,498 Non-Final Office Action dated Jul. 31, 2012, pp. 1-20.
United States Patent and Trademark Office. U.S. Appl. No. 12/561,498 Non-Final Office Action dated May 22, 2013, pp. 1-24.
United States Patent and Trademark Office, U.S. Appl. No. 12/561,498 Final Office Action dated Jan. 18, 2013, pp. 1-23.

* cited by examiner

MULTIFERROIC ANTENNA AND TRANSMITTER

CROSS-REFERENCE TO RELATED APPLICATIONS

The present disclosure is related to pending U.S. patent application Ser. No. 12/561,498, filed Sep. 9, 2009, entitled "Multiferroic Antenna/Sensor which is assigned to the same assignee as the present application and is incorporated herein in its entirety by reference.

FIELD

The present disclosure is related to antennas, and more particularly to a multiferroic antenna and transmitter.

BACKGROUND

Conventional antennas, such as dipoles, slots and patches that receive an electric field or magnetic field of an incident signal and convert it to an output signal must either protrude from the surface to which they are mounted or require a cavity in the surface behind them. Protruding antennas on aircraft increase drag and present anti-icing and other challenges. Antenna cavities on aircraft also add weight (reducing aircraft range/payloads), take up valuable space, result in holes through structural skins of the aircraft that are subject to lightning and fluid penetration, and are costly to integrate into the structure of the aircraft.

SUMMARY

According to one aspect of the present disclosure, a multiferroic element may include a substrate formed on an electrically conductive ground plane. The substrate may be formed from a material having a predetermined elastic modulus. A layer of piezoelectric material may be formed on the substrate. A layer of magnetostrictive material may be bonded to the layer of piezoelectric material. A mechanical strain is created in the layer of piezoelectric material in response to a voltage signal being applied to the multiferroic element. The mechanical strain in the layer of piezoelectric material causes a mechanical strain in the layer of magnetostrictive material to produce a radio frequency magnetic field that is proportional to the voltage signal for generating a radio frequency electromagnetic wave. The predetermined elastic modulus of the substrate is substantially lower than an elastic modulus of the layer of piezoelectric material.

According to another aspect of the present disclosure, a multiferroic antenna may include an electrical conductive ground plane. A plurality of multiferroic elements may be formed on the ground plane and may be configured in an array to form the multiferroic antenna. Each of the multiferroic elements may include a substrate formed on the ground plane. Each multiferroic element may also include a layer of piezoelectric material formed on the substrate. Each multiferroic element may additionally include a layer of magnetostrictive material bonded to the layer of piezoelectric material. A mechanical strain is created in the layer of piezoelectric material in response to a voltage signal being connected across the ground plane and the layer of magnetostrictive material. The mechanical strain in the layer of piezoelectric material causes a mechanical strain in the layer of magnetostrictive material to produce a radio frequency magnetic field that is proportional to the voltage signal for generating a radio frequency electromagnetic wave.

According to a still further aspect of the present disclosure, a vehicle may include a skin. A transmitter may be mounted in the vehicle for communications and a transmit multiferroic antenna may be connected to the transmitter and mounted on the skin. The transmit multiferroic antenna may include an electrical conductive ground plane. A plurality of multiferroic elements may be formed on the electrically conductive ground plane and configured in an array to form the multiferroic antenna. Each of the multiferroic elements may include a substrate formed on the ground plane. Each of the multiferroic elements may also include a layer of piezoelectric material formed on the substrate. Each of the multiferroic elements may also include a layer of magnetostrictive material bonded to the layer of piezoelectric material. A mechanical strain is created in the layer of piezoelectric material in response to a voltage signal being connected across the ground plane and the layer of magnetostrictive material. The mechanical strain in the layer of piezoelectric material causes a mechanical strain in the layer of magnetostrictive material to produce a radio frequency magnetic field that is proportional to the voltage signal for generating a radio frequency electromagnetic wave.

According to another aspect of the present disclosure, a method for generating a radio frequency electromagnetic wave may include applying a voltage signal to a multiferroic element to create a mechanical strain in a layer of piezoelectric material bonded to a layer of magnetostrictive material of the multiferroic element in response to the voltage signal being applied. The mechanical strain in the layer of piezoelectric material causes a mechanical strain in the layer of magnetostrictive material to produce a radio frequency magnetic field that is proportional to the voltage signal for generating the radio frequency electromagnetic wave. The piezoelectric material may be formed on a substrate on an electrically conductive ground plane. The substrate may be formed from a material having a predetermined elastic modulus that is substantially lower than an elastic modulus of the layer of piezoelectric material.

The features, functions, and advantages that have been discussed can be achieved independently in various embodiments of the present disclosure or may be combined in yet other embodiments further details of which can be seen with reference to the following description and drawings.

BRIEF DESCRIPTION OF THE DRAWINGS

The present disclosure is further described in the detailed description which follows in reference to the noted plurality of drawings by way of non-limiting examples of embodiments of the present disclosure in which like reference numerals represent similar parts throughout the several views of the drawings and wherein.

DETAILED DESCRIPTION

The following detailed description of embodiments refers to the accompanying drawings, which illustrate specific embodiments of the disclosure. Other embodiments having different structures and operation do not depart from the scope of the present disclosure.

Figure 1:
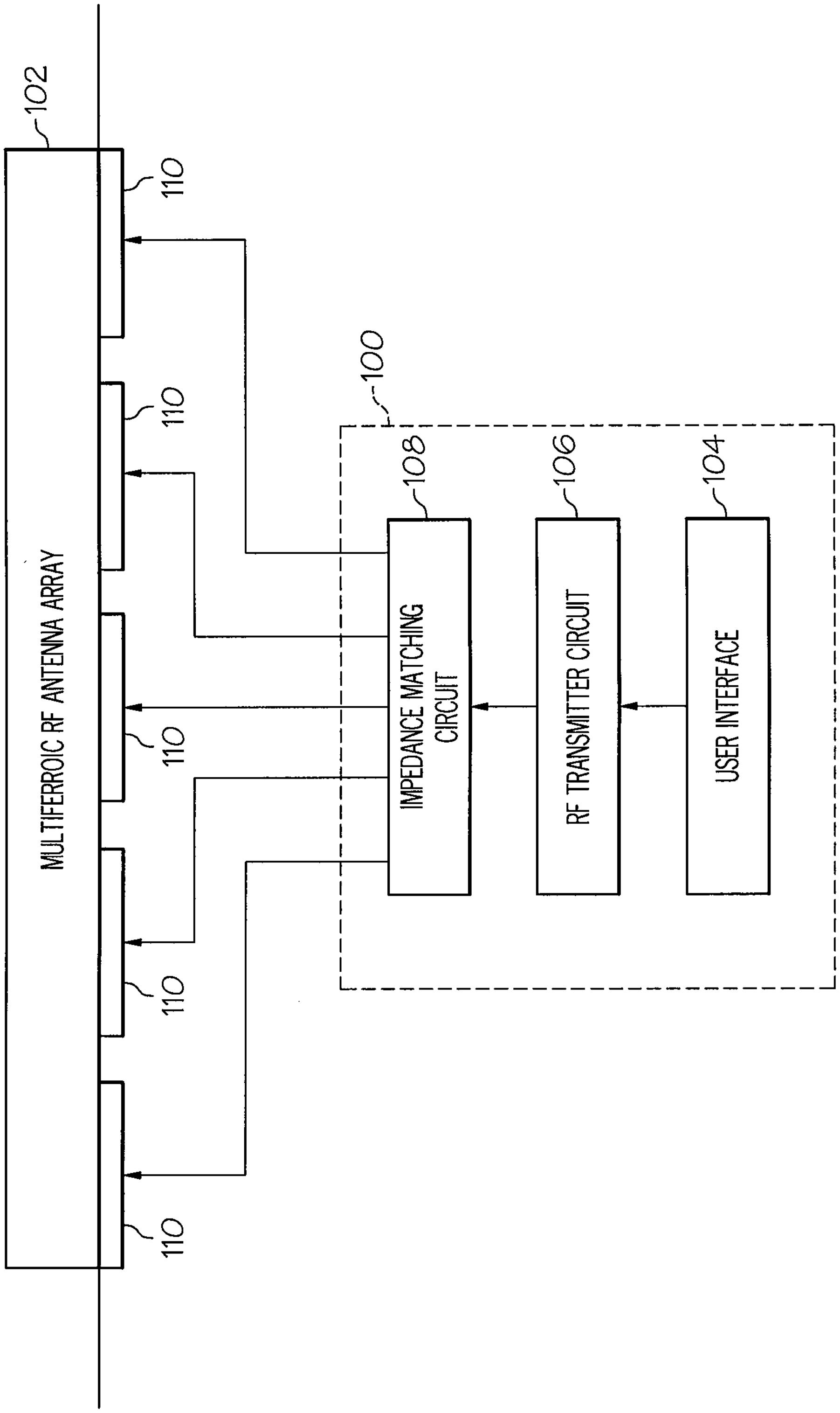
FIG. 1 is a block schematic diagram of an example of a transmitter and multiferroic transmit antenna according to an embodiment of the present disclosure.

FIG. 1 is a block schematic diagram of an example of a transmitter 100 and multiferroic transmit antenna 102 according to an embodiment of the present disclosure. The multiferroic transmit antenna may be a multiferroic radio frequency (RF) antenna array. An example of a multiferroic transmit antenna array or array of multiferroic elements forming an antenna will be described in more detail with reference to FIGS. 3A and 3B. An example of a multiferroic antenna element 200 will be described in more detail with reference to FIG. 2.

The transmitter 100 may include a user interface 104 for controlling the transmitter 100 and inputting information or signals for transmission by the transmitter 100. Audio signals, video signals, a combination of audio and visual signals or other electrical signals may be received by the user interface 104. The transmitter 100 may also include a RF transmitter circuit 106 for converting electrical signals from the user interface 104 into RF signals for transmission by the multiferroic transmit antenna 102.

The transmitter 100 may also include an impedance matching circuit 108 to match an impedance of the transmitter 100 to an input of the antenna 102. The antenna 102 may include a plurality of inputs or drive ports 110. As described in more detail herein, the antenna 102 or antenna array may be subdivided into groups of elements. The groups of elements may be driven by different drive ports 110 or inputs. The groups of elements may be driven either in-phase or out-of-phase to control a direction of the transmitted signal or electromagnetic wave. The groups of elements may be driven in parallel similar to that illustrated in FIG. 1 or by some other configuration depending upon a desired radiation pattern and layout of the elements.

Figure 2:
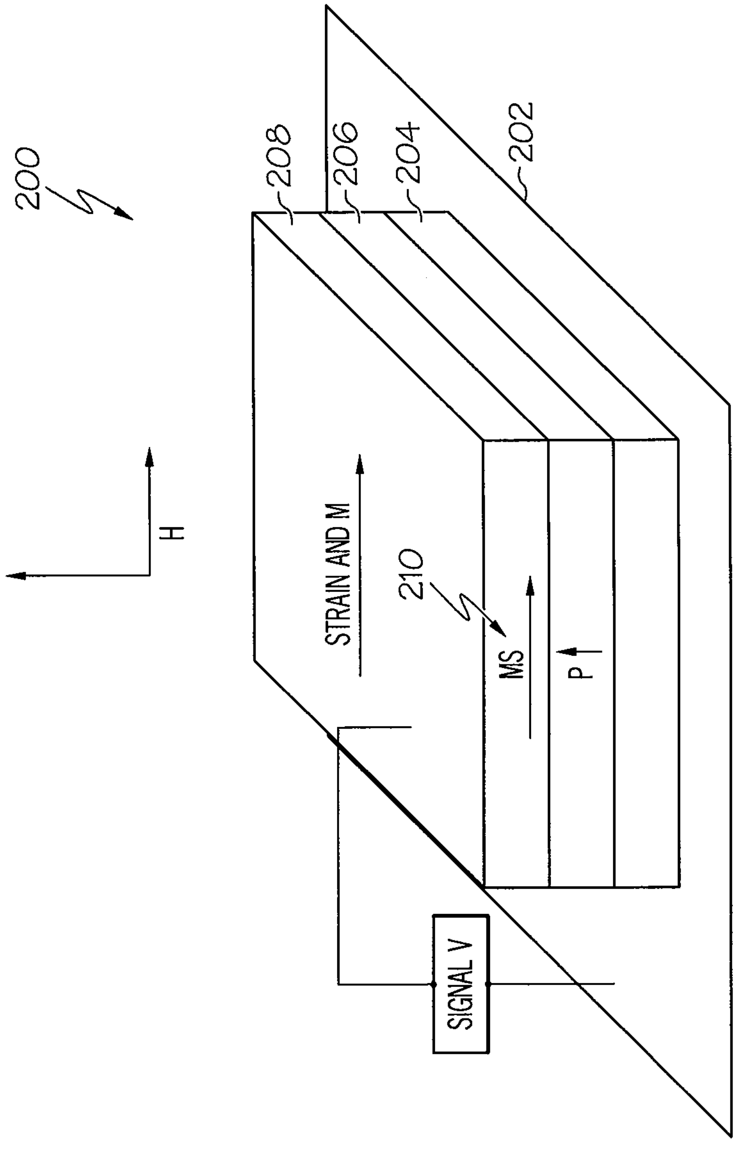
FIG. 2 is a diagram of an example of a multiferroic antenna element according to an embodiment of the present disclosure.

FIG. 2 is a diagram of an example of a multiferroic antenna element 200 according to an embodiment of the present disclosure. As described herein, multiferroic elements, similar to multiferroic antenna element 200 may be arranged in arrays similar to that illustrated in FIGS. 3A and 3B to from a RF transmitter or transmitter antenna.

The multiferroic element 200 may include an electrically conductive ground plane 202. A substrate 204 may be formed on the electrically conductive ground plane 202. A layer of piezoelectric material 206 may be formed on the substrate 204. As described in more detail herein the substrate 204 is preferably a low-modulus substrate to substantially prevent distortion of the multiferroic element 200 when a signal voltage is applied.

A layer of magnetostrictive material 208 may be formed on the layer of piezoelectric material 206. The layer of magnetostrictive material 208 may be bonded to the layer of piezoelectric material 206. A mechanical strain is created in the layer of piezoelectric material 206 in response to a signal voltage ("V") being connected across the ground plane 202 and the layer of magnetostrictive material 208. The layer of magnetostrictive material 208 may be an electrically conductive material and may act as electrode for applying the signal voltage to the layer of piezoelectric material 206. The mechanical strain in the layer of piezoelectric material 206 causes a mechanical strain in the adjacent layer of magnetostrictive material 208 bonded to the layer of piezoelectric material 206. The mechanical strain in the layer of magnetostrictive material 208 may produce a radio frequency magnetic field ("M") that is proportional to the signal voltage ("V"). Lateral dimensions or a size of each multiferroic element 200 on the ground plane 202 is smaller than a wavelength of a lowest mechanical resonance of the multiferroic element 200 to substantially prevent any distortion of the multiferroic element 200 that could affect an electromagnetic wave generated by an antenna containing the multiferroic element 200 or an array of multiferroic elements 200. For example, a multiferroic element made of typical materials as described herein that is designed for 100 MHz operation should be smaller than about 10 microns depending upon material properties. A sufficiently large array of such multiferroic elements 200 may radiate an electromagnetic wave and act as a transmitter.

The substrate 204 may be formed from a material having a predetermined elastic modulus or mechanical modulus. The predetermined elastic modulus of the substrate 204 may be substantially lower than an elastic modulus of the layer of piezoelectric material 206 and the layer of magnetostrictive material 208 to substantially prevent distortion of the multiferroic element 200.

The signal voltage "V" from a transmitter electronics or circuit, such as circuit 106 in FIG. 1, may be applied to the layer of magnetostrictive material 208 which may be an electrically conductive material and may act as an electrode. The signal voltage may be transmitted from the impedance matching circuit 108 to the multiferroic element 200 in a variety of implementations, including a coaxial line, a microstrip, or a stripline. The layer of piezoelectric material 206 may be polarized in a direction perpendicular to the ground plane 202 so that the layer of piezoelectric material 206 is sensitive to the signal voltage "V". As previously discussed, the voltage causes a strain in the layer of piezoelectric material 206 which is enhanced by the low-modulus material between the piezoelectric layer 206 and the ground plane 202 and any underlying structure. The component of the strain parallel to the ground plane 202 causes strain in the adjacent layer of magnetostrictive material 208, which causes the layer of magnetostrictive material 208 to magnetize and generates a magnetic field "H" parallel to the surface of the layer of magnetostrictive material 208 or multiferroic element 200.

A time-varying magnetic field "H" is produced by the voltage V and is equivalent to a radiating magnetic dipole source. Such a source will generate radiating magnetic and electric fields. The applied radio frequency voltage thereby produces radio frequency magnetic and electric fields that are transmitted as an electromagnetic wave.

The layer of piezoelectric material 206 may be any piezoelectric material, such as lead zirconium titanate (PZT), lead-magnesium-niobium-lead titanate (PMN-PT) or other piezoelectric material. Use of piezoelectric materials designed for power applications (such as actuators) may be preferred for generating high amplitude transmitted signals. The thickness of the layer of piezoelectric 206 may be large enough and the modulus high enough that the strain is efficiently transferred to the adjacent layer of the magnetostrictive material 208. The optimum thickness ratio of the layer of magnetostrictive material 208 to the layer of piezoelectric material 206 depends on the relative mechanical modulii of the layers but is typically about ½.

The layer of magnetostrictive material 208 may be any magnetostrictive material, such as for example Terfenol, nickel, Metglas or other magnetostrictive material. The layer of magnetostrictive material 208 may be biased with a static magnetic field (MS) 210 to maximize the radio frequency magnetic field that is generated by the strain. The bias field may be generated by small conventional permanent magnets or by small conventional electromagnets. Bias fields as small as a few Oersteds are sufficient (depending on choice of magnetostrictive materials). For example the bias field may be a direct current (DC) field of about 8 Oersteds for Metglas and up to about 400 Oersteds for Terfenol-D. Lower values may be possible. The magnets or electromagnets may bias single elements 200 or multiple elements. The layer of magnetostrictive material 208 may be formed with a predetermined thickness such that the stress applied by the layer of piezoelectric material 206 causes a uniform strain throughout the layer of magnetostrictive material 208. For example, the layer of magnetostrictive material 208 may be formed with a thickness that is sufficiently small that the stress applied by the layer of piezoelectric material 206 leads to a uniform strain throughout the magnetostrictive layer 208.

Figure 3A:
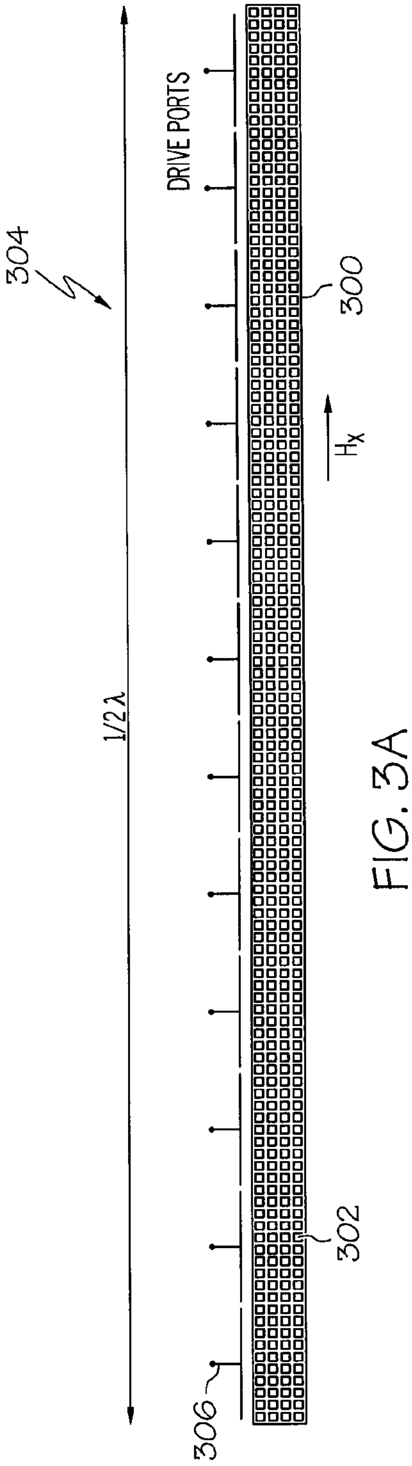
FIG. 3A is a diagram of an example of an array of multiferroic elements forming an antenna according to an exemplary embodiment of the present disclosure.
Figure 3B:
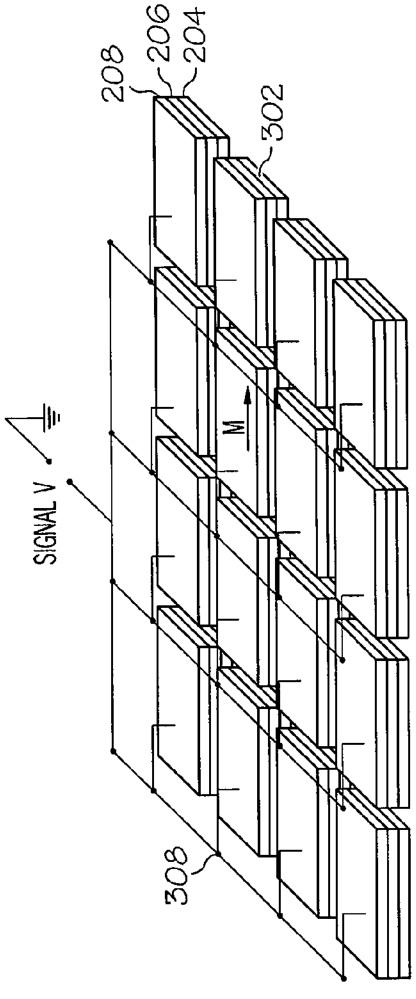
FIG. 3B is a detailed illustration of a portion of the array of multiferroic elements of FIG. 3A showing an exemplary configuration of the multiferroic elements in the array.

FIG. 3A is a diagram of an example of an array 300 of multiferroic elements 302 forming an antenna 304 according to an exemplary embodiment of the present disclosure. FIG. 3B is a detailed illustration of a portion of the array 300 of multiferroic elements 302 of FIG. 3A showing an exemplary configuration of the multiferroic elements 302 in the array 300. The multiferroic elements 302 may be the same as the multiferroic elements 200 described with reference to FIG. 2. The multiferroic elements 302 may be formed on a ground plane (not shown in FIG. 3B for purposes of clarity) similar to ground plane 202 in FIG. 2.

Similar to a conventional antenna, the array 300 of multiferroic elements 302 may be narrow in a predetermined dimension or direction, such as for example in the "y" direction as illustrated in the example of FIG. 3A. In this configuration the array 300 will transmit a toroidal wave having both electric field components Ey and Ez. In another embodiment, an array that has a significant width in the predetermined dimension or direction will predominantly transmit a wave normal to the surface of array 300 of multiferroic elements 302.

Figure 3C:
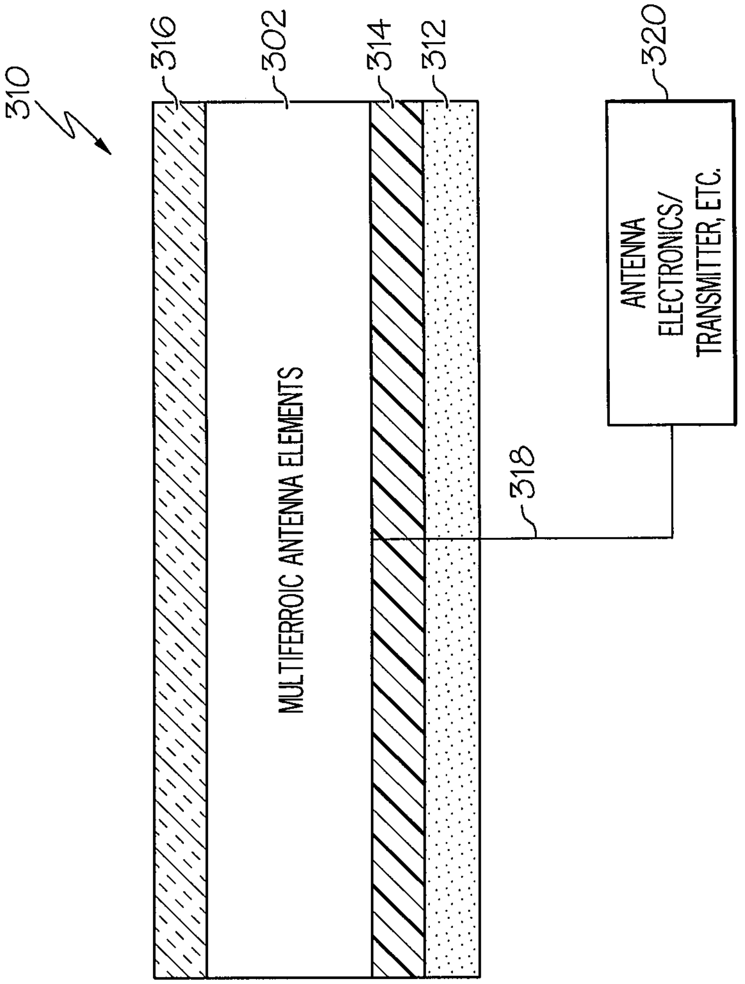
FIG. 3C is a cross-sectional view of an example of a multiferroic antenna appliqué in accordance with an embodiment of the present disclosure.
Figure 4:
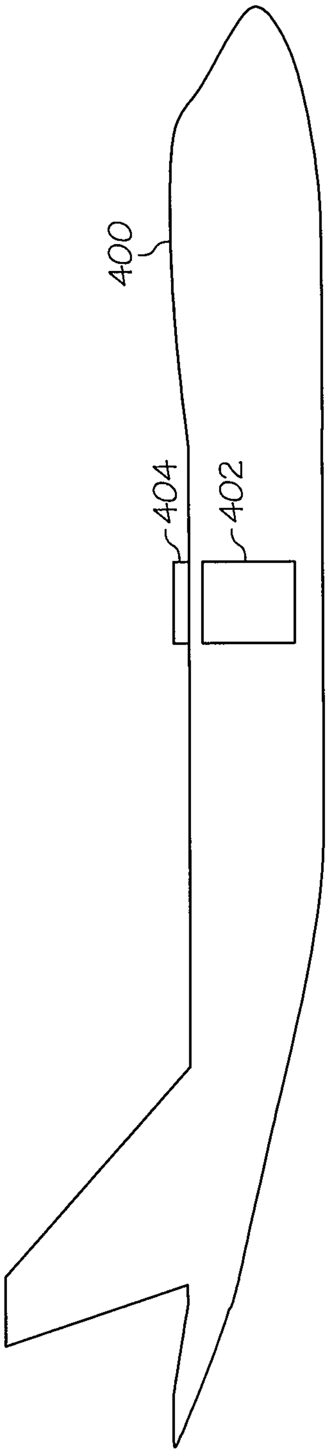
FIG. 4 is an illustration of an aircraft with a transmitter and multiferroic transmit antenna assembly according to an exemplary embodiment of the present disclosure.

While the array 300 illustrated in FIG. 3A is shown to be substantially rectangular and elongated in one dimension, the array 300 may be any shape and may be optimized for minimum cost and minimum interference with other systems when the array 300 is mounted and used in a vehicle, such as an aircraft as illustrated in FIG. 4. For maximum transmission efficiency the antenna array 300 may be ½ wavelengths long as illustrated in FIG. 3A. The array 300 may be subdivided in to lengths and widths of less than about 1/10th wavelengths and all elements 302 in the subdivided lengths may be driven in parallel and in phase. FIG. 3B depicts a means of driving a subarray of elements in parallel with the indicated lead 308. Each of the groups of elements 302 may be driven by a drive port 306. The width of the array 300 may be selected for specific desired radiation patterns. The transmitted power may also be proportional to the width of the array 300. As previously discussed, the antenna substrate 204 in FIG. 2 may have a mechanical modulus or elastic modulus substantially lower than the multiferroic elements 302 to prevent loss of antenna power. The array 300 of multiferroic elements 302 may be in the form of an appliqué that is lightweight and easily replaceable. Appliqués, which are in wide use for aircraft, typically consist of a pressure sensitive layer, a durable polymeric film and additional layers which may provide environmental protection, airline livery, etc. An example of a multiferroic antenna appliqué 310 is illustrated in FIG. 3C. The multiferroic antenna appliqué 310 may include an adhesive layer 312 for attachment to a surface, such as a fuselage of an aircraft or other vehicle surface. A polymeric film 314 may be disposed on the adhesive layer 312. The multiferroic elements 302 may be disposed on the polymeric film 314. A top coat 316 of an insulative material or other non-conductive material may be placed over the multiferroic elements 302 for environmental protection. Electrically conductive leads 318 attach the multiferroic elements 302 to the antenna electronics 320 or transmitter. As an appliqué 310 the multiferroic antenna 300 may be much easier to replace.

The multiferroic elements 302 of the array 300 may form a rectangle or any other convenient shape consistent with any antenna requirements for directionality of the antenna 304. The multiferroic elements 302 may be closely packed or dispersed to facilitate integration with other features, such as features of the vehicle or aircraft 400 in which the antenna 304 is associated or attached as illustrated in the example of FIG. 4. The multiferroic elements 302 may be connected in series, parallel or in any combination or as separate antenna elements depending upon the desired operating characteristics, such as radiation pattern, polarization, power and the like.

FIG. 4 is an illustration of an aircraft 400 with a transmitter 402 and multiferroic transmit antenna assembly 404 according to an exemplary embodiment of the present disclosure. While the example illustrated in FIG. 4 is an aircraft, the transmitter and antenna assembly 404 may be used in association with any vehicles including terrestrial vehicles, watercraft or other applications. The transmitter 402 may be similar to the transmitter 100 described with reference to FIG. 1 and the multiferroic transmit antenna assembly 404 may be similar to the antenna 102 of FIG. 1 and array 300 of FIG. 3A.

The antenna assembly 404 or array may be very thin (a few mils) and may be applied as an appliqué to the aircraft 400. The antenna assembly 404 or array does not require a radome or antenna cavity, nor does it have to protrude from the surface of the aircraft 400. The antenna 404 does not require large penetrations through the aircraft 400 or other skin and only requires small penetrations for coax line ports similar to ports 306 of FIG. 3A.

Figure 5:
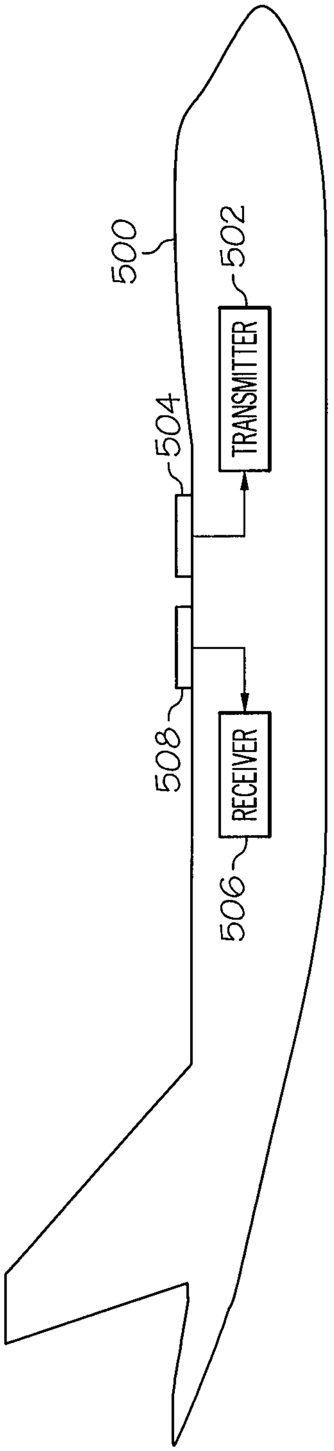
FIG. 5 is an illustration of an aircraft including a combination of a transmitter and multiferroic transmit antenna assembly and a receiver and multiferroic receiver antenna assembly according to an exemplary embodiment of the present disclosure.

FIG. 5 is an illustration of an aircraft 500 including a combination of a transmitter 502 and multiferroic transmit antenna assembly 504 and a receiver 506 and multiferroic receiver antenna assembly 508 according to an exemplary embodiment of the present disclosure. The transmitter 502 may be similar to the transmitter 402 described with reference to FIG. 4 and the multiferroic receiver antenna assembly 504 may be similar to the antenna assembly 404. The antenna assembly 404 may include an array of multiferroic antenna elements similar to array 300 described with reference to FIGS. 3A and 3B.

Figure 6:
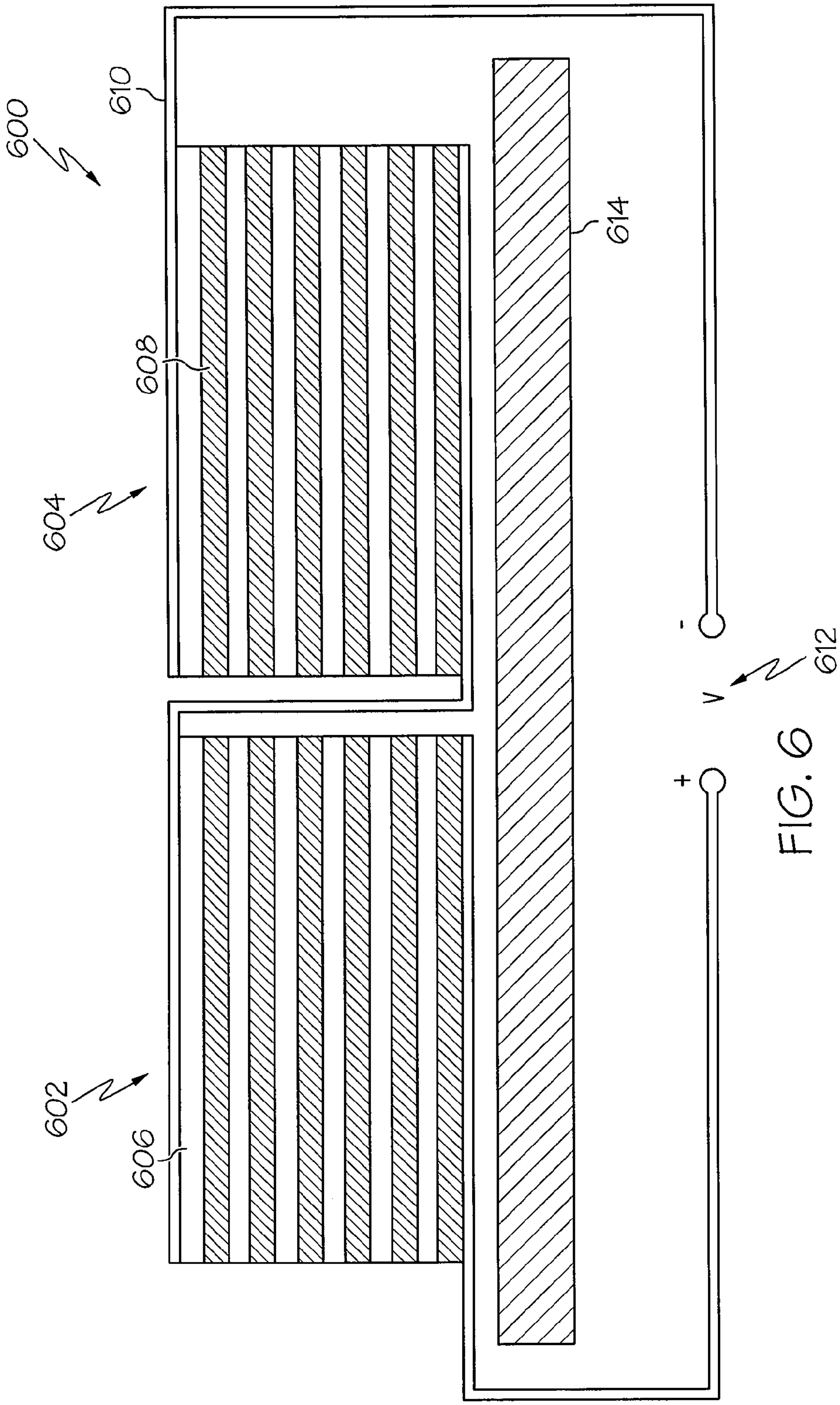
FIG. 6 is an example of a receive multiferroic antenna including a multiferroic sensor in accordance with an exemplary embodiment of the present disclosure.

The receiver 506 and multiferroic receiver antenna assembly 508 may be similar to that described in pending U.S. patent application Ser. No. 12/561,498, filed Sep. 9, 2009, and entitled "Multiferroic Antenna/Sensor which is incorporated herein in its entirety by reference. The multiferroic antennas described herein and those in U.S. patent application Ser. No. 12/561,498 may be combined to form a transmit/receive antenna. Referring also to FIG. 6, FIG. 6 is an example of a receiver multiferroic antenna 600 or multiferroic sensor 602 in accordance with an exemplary embodiment of the present disclosure and similar that described in U.S. patent application Ser. No. 12/561, 498. The multiferroic antenna or sensor 600 may include two multiferroic stacks 602 and 604. Each multiferroic stack 602 and 604 may include alternating layers of magnetostrictive material 606 and piezoelectric material 608. In this exemplary embodiment, two multiferroic stacks 606 and 608 are shown, however, embodiments according to the present disclosure are not limited to two multiferroic stacks and may include one or more than two multiferroic stacks. Further, the multiferroic stacks 602 and 604 in this example embodiment are connected together in series by an interconnect material 610 that may be a wire, or any other conductive material. The interconnect material 610 may provide a connection from a first end of the first multiferroic stack 602 to a first end of the second multiferroic stack 604. Further, a portion of the interconnect material 610 may connect a second end of the first multiferroic stack 602 to one multiferroic sensor output and another portion of the interconnect material 610 may connect a second end of the second multiferroic stack 608 to a second multiferroic sensor output. The two multiferroic stacks 602 and 604 with the interconnect material 610 may be isolated from electrical connects for an output voltage 612 by a thin electrically insulating layer 614 between the two multiferroic stacks 602 and 604 and the electrical connects producing the output voltage 612.

Each multiferroic stack 602 and 604 may include multiple stacked multiferroic layers-pairs where each multiferroic layer-pair consists of an alternating layer of the magnetostrictive material 606 and a piezoelectric material 608 bonded together enabling a high signal sensitivity. A magnetic field of an incident signal on each multiferroic layer-pair of magnetostrictive material 606 and piezoelectric material 608 causes mechanical strain in the magnetostrictive material 606 layers that strain adjacent piezoelectric material layers 608 producing an electrical voltage from each multiferroic layer-pair proportional to the magnitude of the incident signal. A built-in mechanical polarization (i.e., a bias strain) yields increased sensitivity to an incident signal's magnetic field. A sum of the voltages from all multiferroic layer-pairs is the multiferroic sensor output voltage 612. Therefore, the multiferroic sensor output voltage 612 consists of the electrical voltage from each multiferroic layer-pair amplified proportional to a total number of multiple connected multiferroic layered-pairs in the multiferroic stacks 602 and 604. In this exemplary embodiment of the present disclosure, with the two multiferroic stacks 602 and 604 are connected in series, an output voltage from each stack is added together to produce the total output voltage 612 from the multiferroic sensor or antenna 600.

The multiferroic antenna described herein is capable of operating over a wide frequency band, power levels, directionality and temperature extremes. For example, a 1 meter long array may transmit efficiently from about 50 MHz to about 18 GHz with the low frequency limit determined by the requirement for the length to be at least ¼ wavelengths and the high frequency limit by the number of drive ports. The power level is determined by the size of the array and by the material properties. For example a 0.0014 volt signal applied to a 1 micron thick PMN-PT having a piezoelectric coefficient of about $-7e^{-10}$ m/V will generate a strain parallel to the surface of the array of approximately 1 microstrain. This strain will transfer to the magnetostrictive layer with about a 0.5 coupling factor resulting in a strain of about 0.5 microstrains. If the magnetostrictive material is, for example, Permalloy having a magnetostriction coefficient of about $7e^{-8}$ m/A with a 5 A/m bias field then the strain-induced magnetization in the Permalloy is about 1 Gauss and this creates an external magnetic field parallel to the surface of approximately 5 A/m. Then a 1 m by 2 cm well-matched antenna consisting of an array of closely spaced elements will emit about 100 watts of transmitted power. Typical magnetostrictive and piezoelectric materials are capable of much higher strains and magnetizations leading to expectation that much larger power levels can be transmitted. At some point cooling may be appropriate to prevent overheating above the piezoelectric "Curie point" which is typically about 150° C. The temperature range of the array described herein may range from near-absolute zero to the Curie point.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A multiferroic element, comprising:

a substrate formed on an electrically conductive ground plane, the substrate being formed from a material having a predetermined elastic modulus;

a layer of piezoelectric material formed on the substrate; and a layer of magnetostrictive material bonded to the layer of piezoelectric material, wherein a mechanical strain is created in the layer of piezoelectric material in response to a voltage signal being applied to the multiferroic element, the mechanical strain in the layer of piezoelectric material causing a mechanical strain in the layer of magnetostrictive material to produce a radio frequency magnetic field that is proportional to the voltage signal for generating a radio frequency electromagnetic wave, wherein the predetermined elastic modulus of the substrate is substantially lower than an elastic modulus of the layer of piezoelectric material substantially preventing distortion of the multiferroic element when the voltage signal is applied.

2. The multiferroic element of claim 1, wherein the layer of piezoelectric material of the multiferroic element is polarized in a direction perpendicular to the ground plane so that the layer of piezoelectric material of the multiferroic element is sensitive to the voltage signal.

3. The multiferroic element of claim 1, wherein the layer of piezoelectric material comprises one of lead zirconium titanate (PZT) and lead-magnesium-niobium-lead-titanate (PMN-PT).

4. The multiferroic element of claim 1, wherein an optimum thickness ratio of the layer of magnetostrictive material to the layer of piezoelectric material depends upon a relative elastic modulus of each layer.

5. The multiferroic element of claim 1, wherein an optimum thickness ratio of the layer of magnetostrictive material to the layer of piezoelectric material is about ½.

6. The multiferroic element of claim 1, wherein the layer of magnetostrictive material comprises one of nickel and Terfenol.

7. The multiferroic element of claim 1, wherein the layer of magnetostrictive material is biased by a static magnetic field to substantially maximize the radio frequency magnetic field generated by the strain.

8. The multiferroic element of claim 1, wherein the layer of magnetostrictive material is formed with a predetermined thickness to cause the strain from the layer of piezoelectric material to be substantially uniform throughout the layer of magnetostrictive material.

9. A multiferroic antenna, comprising:
an electrically conductive ground plane;
a plurality of multiferroic elements formed on the electrically conductive ground plane, the plurality of multiferroic elements being configured in an array to form the multiferroic antenna, each of the multiferroic elements comprising:
a substrate formed on the ground plane;
a layer of piezoelectric material formed on the substrate; and
a layer of magnetostrictive material bonded to the layer of piezoelectric material, wherein a mechanical strain is created in the layer of piezoelectric material in response to a voltage signal being connected across the ground plane and the layer of magnetostrictive material, the mechanical strain in the layer of piezoelectric material causing a mechanical strain in the layer of magnetostrictive material to produce a radio frequency magnetic field that is proportional to the voltage signal for generating a radio frequency electromagnetic wave, wherein the substrate comprises a material having a predetermined elastic modulus substantially lower than an elastic modulus of the layer of piezoelectric material and the layer of magnetostrictive material that substantially prevents distortion of the multiferroic element and loss of antenna power when the voltage signal is connected.

10. The multiferroic antenna of claim 9, wherein each multiferroic element comprises a lateral dimension on the substrate that is smaller than a wavelength of a lowest mechanical resonance of each multiferroic element to substantially prevent distortion.

11. The multiferroic antenna of claim 9, wherein the layer of piezoelectric material of each multiferroic element is polarized in a direction perpendicular to the ground plane so that the layer of piezoelectric material of each multiferroic element is sensitive to the voltage signal, wherein the predetermined elastic modulus of the substrate substantially enhances the mechanical strain caused in the layer of piezoelectric material of each multiferroic element, a component of strain parallel to the ground plane causes strain in the layer of magnetostrictive material to cause the layer of magnetostrictive material to become magnetized and to generate a magnetic field parallel to a surface of the layer of magnetostrictive material.

12. The multiferroic antenna of claim 9, wherein an optimum thickness ratio of the layer of magnetostrictive material to the layer of piezoelectric material depends upon a relative elastic modulus of each layer.

13. The multiferroic antenna of claim 9, wherein the array of multiferroic elements is configured to transmit a predetermined radiation pattern.

14. The multiferroic antenna of claim 9, wherein the array of multiferroic elements are subdivided into groups of multiferroic elements, each group having a length and width less than about 1/10 wavelength and wherein the multiferroic elements in each group are driven in parallel and in-phase.

15. The multiferroic antenna of claim 9, wherein the array of multiferroic elements is subdivided into groups of multiferroic elements, wherein each group of elements is driven either in-phase or out-phase to control a direction of transmission of the electromagnetic wave.

16. A vehicle, comprising:
a skin;
a transmitter mounted in the vehicle for communications;
a transmit multiferroic antenna connected to the transmitter and mounted on the skin, wherein the transmit multiferroic antenna comprises:
an electrically conductive ground plane;
a plurality of multiferroic elements formed on the electrically conductive ground plane and configured in an array to form the multiferroic antenna, each of the multiferroic elements comprising:
a substrate formed on the ground plane;
a layer of piezoelectric material formed on the substrate; and
a layer of magnetostrictive material bonded to the layer of piezoelectric material, wherein a mechanical strain is created in the layer of piezoelectric material in response to a voltage signal being connected across the ground plane and the layer of magnetostrictive material, the mechanical strain in the layer of piezoelectric material causing a mechanical strain in the layer of magnetostrictive material to produce a radio frequency magnetic field that is proportional to the voltage signal for generating a radio frequency electromagnetic wave, wherein the substrate comprises a material having a predetermined elastic modulus substantially lower than an elastic modulus of the layer of piezoelectric material and the layer of magnetostrictive material that substantially prevents distortion of the multiferroic element and loss of antenna power when the voltage signal is connected.

17. The vehicle of claim 16, wherein the array of multiferroic elements are subdivided into groups of multiferroic elements, each group having a length and width less than about 1/10 wavelength and wherein the multiferroic elements in each group are driven in parallel and in-phase.

18. The vehicle of claim 16, wherein the array of multiferroic elements is subdivided into groups of multiferroic elements, wherein each group of elements is driven either in-phase or out-phase to control a direction of transmission of the electromagnetic wave.

19. The vehicle of claim 16, further comprising a receive multiferroic antenna including a multiferroic sensor, an antenna including a multiferroic sensor, the multiferroic sensor comprising a multiferroic stack residing on an outside of the skin, the multiferroic stack comprising multiple connected multiferroic layer-pairs, each multiferroic layer-pair comprising an alternating layer of a magnetostrictive material and a piezoelectric material bonded together enabling a high signal sensitivity, a magnetic field of an incident signal causing mechanical strain in the magnetostrictive material layers that strains adjacent piezoelectric material layers producing an electrical voltage in each multiferroic layer-pair proportional to the incident signal, wherein an output of the multiferroic sensor comprises the electrical voltage amplified proportional to a total number of multiple connected multiferroic layer-pairs in the multiferroic stack.

20. A method for generating a radio frequency electromagnetic wave, comprising:
applying a voltage signal to a multiferroic element to create a mechanical strain in a layer of piezoelectric material bonded to a layer of magnetostrictive material of the multiferroic element in response to the voltage signal being applied to the multiferroic element, the mechanical strain in the layer of piezoelectric material causing a mechanical strain in the layer of magnetostrictive material to produce a radio frequency magnetic field that is proportional to the voltage signal for generating the radio frequency electromagnetic wave, wherein the piezoelectric material is formed on a substrate on an electrically conductive ground plane, the substrate being formed from a material having a predetermined elastic modulus that is substantially lower than an elastic modulus of the layer of piezoelectric material substantially preventing distortion of the multiferroic element when the voltage signal is applied.

21. The method of claim 20, further comprising polarizing the layer of piezoelectric material of the multiferroic element in a direction perpendicular to the ground plane so that the layer of piezoelectric material of the multiferroic element is sensitive to the voltage signal.

22. The method of claim 20, further comprising biasing the layer of magnetostrictive material by a static magnetic field to substantially maximize the radio frequency magnetic field.

23. The method of claim 20, further comprising forming the layer of magnetostrictive material with a predetermined thickness to cause the strain from the layer of piezoelectric material to be substantially uniform throughout the layer of magnetostrictive material.

* * * * *

UNITED STATES PATENT AND TRADEMARK OFFICE

CERTIFICATE OF CORRECTION

PATENT NO. : 8,803,751 B1
APPLICATION NO. : 12/885817
DATED : August 12, 2014
INVENTOR(S) : Robert J. Miller, William Preston Geren and Stephen P. Hubbell It is certified that error appears in the above-identified patent and that said Letters Patent is hereby corrected as shown below:

Title page, item (75), change "William Preston Geren, Shoeline, WA (US)" to --William Preston Geren, Shoreline, WA (US)--.

Signed and Sealed this
Eighteenth Day of November, 2014

Michelle K. Lee
*Deputy Director of the United States Patent and Trademark Office*